United States Patent [19]
Taketa et al.

[11] Patent Number: 5,939,749
[45] Date of Patent: *Aug. 17, 1999

[54] SPLIT GATE TRANSISTOR ARRAY

[75] Inventors: Kaoru Taketa, Ogaki; Takayuki Kaida, Gifu-ken, both of Japan

[73] Assignee: Sanyo Electric Company, Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/824,213

[22] Filed: Mar. 25, 1997

[30] Foreign Application Priority Data

Mar. 29, 1996 [JP] Japan ................................. 8-077147
Sep. 30, 1996 [JP] Japan ................................. 8-258980

[51] Int. Cl.$^6$ ........................... H01L 29/68; H01L 29/78
[52] U.S. Cl. .................... 257/316; 257/319; 257/900; 365/185
[58] Field of Search ......................... 365/185; 257/316, 257/315, 319

[56] References Cited

U.S. PATENT DOCUMENTS

| | | | |
|---|---|---|---|
| 4,861,730 | 8/1989 | Hsia et al. ................................. | 437/43 |
| 5,029,130 | 7/1991 | Yeh ......................................... | 365/185 |
| 5,231,299 | 7/1993 | Ning et al. ............................... | 257/316 |
| 5,461,249 | 10/1995 | Ozawa ..................................... | 257/321 |
| 5,510,639 | 4/1996 | Okuda et al. ............................. | 257/316 |
| 5,691,937 | 11/1997 | Ohta ........................................ | 365/185.01 |

FOREIGN PATENT DOCUMENTS

| | | | |
|---|---|---|---|
| 57-76878 | 5/1982 | Japan ....................................... | 257/316 |
| 4-34970 | 2/1992 | Japan ....................................... | 257/316 |
| WO 92/18980 | 10/1992 | WIPO ....................................... | 365/185 |

*Primary Examiner*—Donald L. Monin, Jr.
*Attorney, Agent, or Firm*—Sheridan Ross P.C.

[57] ABSTRACT

A split gate transistor having a semiconductor substrate, a source region and a drain region formed on the semiconductor substrate. A channel region is formed between the source region and the drain region. A floating gate electrode is formed substantially above the channel region. The floating gate electrode has an end surface. A control gate electrode is provided over the semiconductor substrate so as to overlap the floating gate electrode. The control gate electrode has an end surface formed level with the end surface of the floating gate electrode.

9 Claims, 15 Drawing Sheets

Fig.12 (Prior Art)

| Operation mode | Write | Erase | Read | Stand by |
|---|---|---|---|---|
| Word line WLm (control gate electrode 9) | 2V | 14 to 15V | 4V | 0V |
| Bit line (Drain region 4) | 0V | 0V | 2V | 0V |
| Common source line SL (Source region 3) | 12V | 0V | 0V | 0V |
| Substrate 2 | 0V | 0V | 0V | 0V |

Fig.15 (Prior Art)

| Operation mode | Write | Erase | Read | Stand by |
|---|---|---|---|---|
| Word line WLm (control gate electrode 9) | 2V | 14 to 15V | 4V | 0V |
| Bit line (Drain region 4) | 12V | 0V | 2V | 0V |
| Common source line SL (Source region 3) | 0V | 0V | 0V | 0V |
| Substrate 2 | 0V | 0V | 0V | 0V |

SPLIT GATE TRANSISTOR ARRAY

BACKGROUND OF THE INVENTION

1. Field of the Invention

The present invention relates to a non-volatile semiconductor memory device using split gate transistors.

2. Description of the Related Art

Recently, great attention is being paid to non-volatile semiconductor memory devices that include a Ferro-electric Random Access Memory, EPROM (Erasable and Programmable Read Only Memory) and EEPROM (Electrically Erasable and Programmable Read Only Memory). In the EPROM and EEPROM, charges are stored in the floating gate electrode as data, and this data is read by detecting a change in threshold voltage depending on the presence or absence of the charges by means of the control gate electrode. The EEPROM includes a flash EEPROM that can collectively erase data in the whole memory cell array or can partially erase data, block by block, from the memory cell array separated to an arbitrary number of blocks.

A plurality of memory cells (or memory transistors) constituting a flash EEPROM are classified to two types: stacked gate type and split gate type. In a flash EEPROM using stacked gate memory cells, each memory cell cannot self-select its own ON/OFF state. If charges are excessively drained from the floating gate electrode at the time of data erasure, therefore, the channel region becomes conductive even when a predetermined voltage (e.g., 0 V) for rendering each memory cell non-conductive is applied to the control gate electrode. As a result, that memory cell always becomes conductive, thus causing the so-called excess erasure by which reading of stored data is disabled. To prevent this excess erasure, the erasing procedures of the individual memory cells should be controlled by a peripheral circuit of the memory device or by an external circuit connected to the memory device.

As one solution to avoid the excess erasure of the stacked gate memory cells, split gate memory cells have been developed. International Patent Publication No. WO92/18980 discloses a flash EEPROM that uses split gate type memory cells.

FIG. 10 shows a cross section of a part of the memory cell array of a flash EEPROM using conventional split gate memory cells. The memory cell array 152 comprises a plurality of split gate memory cells (split gate transistors) 1 formed on a P type single crystalline silicon substrate 2. Each memory cell 1 has a source region 3, a drain region 4, a channel region 5, a floating gate electrode 7 and a control gate electrode 9.

Formed on the P type single crystalline silicon substrate 2 are the source region 3 and drain region 4 both of an N type. The floating gate electrode 7 is formed over the channel region 5, defined between the source region 3 and drain region 4, via a gate insulator film 6 formed of a silicon oxide film. The control gate electrode 9 is formed over the floating gate electrode 7 via an insulator film 19 and a tunnel insulator film 8, which are formed by LOCOS (Local Oxidation on Silicon).

The control gate electrode 9 does not entirely overlap the floating gate electrode 7. As one sees the gate electrodes 7 and 9 from above the substrate 2, substantially half of the floating gate electrode 7 protrudes sideways from the control gate electrode 9. Projections 7a are formed at both ends of the upper portion of the floating gate electrode 7 at the same time as the insulator film 19 is formed.

A part of the control gate electrode 9 is arranged over the channel region 5 via the insulator films 6 and 8 to constitute a select gate 10. The select gate 10, together with the source region 3 and the drain region 4, forms a select transistor 11. In the split gate type memory cell 1, therefore, a transistor, which is formed by the gate electrodes 7 and 9 and the regions 3 and 4, is connected in series to the select transistor 11.

To suppress the occupying area on the substrate 2, two memory cells 1 (which will hereinafter be denoted as "1a" and "1b" to distinguish therebetween) share the source region 3 and their floating gate electrodes 7 and control gate electrodes 9 are arranged symmetrically with respect to that common source region 3.

A passivation film 12 is formed on the memory cells 1. Each drain region 4 is connected to a drain electrode 17 in a contact hole 16. A side wall spacer 18 comprised of an insulator film is formed on the inner wall of the contact hole 16.

FIG. 11 shows the general structure of a flash EEPROM 151 using the split gate memory cells 1. The memory cell array 152 has a plurality of memory cells 1 arranged in a matrix form. The control gate electrodes 9 of a row of memory cells 1 form a single word line WLa, WLb, ... or WLz per row. The drain electrodes 17 of a column of memory cells 1 form a single bit line BLa, BLb, ... or BLz per column.

The individual memory cells 1b connected to each odd word line (WLa, ..., WLm, ..., WLy) and the individual memory cells 1a connected to each even word line (WLb, ..., WLn, ..., WLz) share their associated source regions 3, which form a plurality of source lines RSLa to RSLm. For example, the memory cells 1b connected to the word line WLa and the memory cells 1a connected to the word line WLb share their source regions 3, which form the source line RSLa. The individual source lines RSLa–RSLm are connected to a common source line SL.

The individual word lines WLa–WLz are connected to a row decoder 153, and the individual bit lines BLa–BLz are connected to a column decoder 154. A row address and a column address, which have been designated externally, are supplied to an address pin 155. The address pin 155 transfer the row address and column address to an address latch 157 via an address buffer 156. The address latch 157 transfers the latched row address to the row decoder 153 and the latched column address signal to the column decoder 154.

The row decoder 153 selects one of the word lines WLa–WLz (e.g., WLm), which is associated with the latched row address, and controls the electric potential on the selected word line WLm in accordance with each of the operation modes illustrated in FIG. 12.

The column decoder 154 selects one of the bit lines BLa–BLz (e.g., BLm), which is associated with the latched column address, and controls the electric potential on the selected bit line BLm in accordance with each operation mode shown in FIG. 12.

The common source line SL is connected to a source line bias circuit 162, which controls the electric potentials on the individual source lines RSLa–RSLm via the common source line SL in accordance with each operation mode shown in FIG. 12.

Externally specified data is supplied to a data pin 158 through which the data is transferred to the column decoder 154 via an input buffer 159. In accordance with the data, the column decoder 154 controls the electric potential on the selected one of the bit lines BLa–BLz.

Data read from an arbitrary memory cell 1 is supplied to the column decoder 154 via the associated one of the bit lines BLa–BLz. The data is then transferred from the column decoder 154 to a sense amplifier group 160 which comprises a plurality of sense amplifiers (not shown). The column decoder 154 connects the selected bit line BLm to the associated sense amplifier. The data that has been discriminated in the sense amplifier group 160 is sent out from the data pin 158 via an output buffer 161. The operations of the individual circuits 153–162 are controlled by a control core circuit 163.

The individual operation modes (the erase mode, write mode, read mode and standby mode) of the flash EEPROM 151 will now be discussed referring to FIG. 12.

(a) Erase Mode

In erase mode, the electric potentials of all the source lines RSLa–RSLm and the bit lines BLa–BLz are kept at the ground level (=0 V). A voltage of 14 to 15 V is applied to a selected word line WLm and a voltage of the ground level is applied to the other, non-selected word lines WLa–WLl and WLn–WLz. Therefore, the electric potentials of the control gate electrodes 9 of the memory cells 1 that are connected to the selected word line WLm are pulled up to 14 to 15 V.

The electrostatic capacitances between the source region 3 and substrate 2 and the floating gate electrode 7 are set significantly greater than the electrostatic capacitance between the control gate electrode 9 and the floating gate electrode 7. When the electric potential of the control gate electrode 9 is 14 to 15 V and the electric potential of the drain is 0 V, therefore, a high electric field is produced between the control gate electrode 9 and the floating gate electrode 7. Consequently, a Fowler-Nordheim (FN) tunnel current flows between both gate electrodes, so that electrons in the floating gate electrode 7 are drained toward the control gate electrode 9, as indicated by an arrow A in FIG. 10. As a result, data stored in the memory cells 1 is erased.

As the electrons in the floating gate electrode 7 travel toward the control gate electrode 9, the electrons jump out from the projections 7a. This facilitates the electron migration so that the electrons in the floating gate electrode 7 can be drained efficiently. This erasure is performed on all the memory cells 1 that are connected to the selected word line WLm.

(b) Write Mode

In write mode, the electric potential on the bit line BLm that is connected to the drain region 4 of the selected memory cell 1 is set to the ground level. A voltage of 4 V is applied to the other, non-selected bit lines BLa–BLl and BLn–BLz. A voltage of 2 V is applied to the word line WLm that is connected to the control gate electrode 9 of the selected memory cell 1, and the voltage of the ground level is applied to the other, non-selected word lines WLa–WLl and WLn–WLz. A voltage of 12 V is applied to all the source lines RSLa–RSLm.

The threshold voltage, Vth, of the select transistor 11 of each memory cell 1 is 0.5 V. In the selected memory cell 1, therefore, the electrons in the drain region 4 travel into the channel region 5, the conductivity of which has been inverted to an N type from a P type. Accordingly, the cell current flows toward the drain region 4 from the source region 3.

A voltage of 12 V is applied to the source region 3. Therefore, the electric potential of the floating gate electrode 7 is pulled up by the capacitive coupling between the source region 3 and the floating gate electrode 7, thus producing a high electric field between the channel region 5 and the floating gate electrode 7. Thus, the electrons in the channel region 5 are accelerated to become hot electrons, which are supplied to the floating gate electrode 7 as indicated by an arrow B in FIG. 10. Consequently, charges are stored in the floating gate electrode 7 of the selected memory cell 1 and 1-bit data is written and stored there. Unlike the erasure, this write operation can be executed for each selected memory cell 1.

(c) Read Mode

In read mode, a voltage of 4 V is applied to the word line WLm that is connected to the control gate electrode 9 of the selected memory cell 1, and the voltage of the ground level is applied to the other, non-selected word lines WLa–WLl and WLn–WLz. A voltage of 2 V is applied to the bit line BLm that is connected to the drain region 4 of the selected memory cell 1, and the voltage of the ground level is applied to the other, non-selected bit lines BLa–BLl and BLn–BLz.

As mentioned earlier, electrons are drained from the floating gate electrode 7 of a data-erased memory cell 1. Further, electrons are supplied into the floating gate electrode 7 of a data-written memory cell 1. Therefore, the channel region 5 directly below the floating gate electrode 7 of the data-erased memory cell 1 is conducting or is enabled, and the channel region 5 directly below the floating gate electrode 7 of the data-written memory cell 1 is not conducting or is disabled. Thus, the cell current that flows toward the source region 3 from the drain region 4 when 4 V is applied to the control gate electrode 9 is greater for the data-erased memory cell 1 than for the data-written memory cell 1.

As the level of the cell current flowing in each memory cell 1 is discriminated by the associated sense amplifier in the sense amplifier group 160, the value of data in the data-erased memory cell 1 can be read. For example, a data value is read with "1" as the data value in the data-erased memory cell 1 or "0" as the data value in the data-written memory cell 1. In this manner, binary data having a data value "1" indicating the erased state and a data value "0" indicating the written state can be stored in each memory cell 1.

(d) Standby Mode

In standby mode, the voltage of the ground level is applied to the common source line SL, all the word lines WLa–WLz and all the bit lines BLa–BLz. In this standby mode, no operation is performed to any memory cell 1.

Since the select transistors 11 are provided in the flash EEPROM using the thus constituted split gate memory cells, each memory cell can self-select its ON/OFF state. That is, the select transistor 11 provided in each memory cell 1 allows the memory cell to select its own conductive/non-conductive state.

Even if charges are excessively drained from the floating gate electrode 7 at the time of data erasure, therefore, the channel region 5 can be rendered non-conductive by the select gate 10. Thus, excessive erasure, if it occurs, does not raise any problem because the conductive/non-conductive states of the memory cells 1 can be controlled by the select transistors 11.

U.S. Pat. No. 5,029,130 discloses another flash EEPROM in which the source region 3 of the split gate memory cell 1 shown in FIG. 10 is changed to a drain region while the drain region 4 of the memory cell 1 is changed to a source region. FIG. 13 is a cross-sectional view showing a part of the memory cell array of a flash EEPROM using such modified memory cells 21. FIG. 14 illustrates the general structure of a flash EEPROM 171, which uses the memory cells 21. FIG. 15 shows voltages at the individual sections of the flash EEPROM 171 in individual operation modes.

The split gate memory cell 21 in FIG. 13 differs from the split gate memory cell 1 in FIG. 10 in that the source region and the drain region of the former memory cell 21 are respectively called the drain region and the source region in the latter memory cell 1. That is, the source region 3 of the memory cell 21 is called the drain region 4 in the memory cell 1, and the drain region 4 of the memory cell 21 is called the source region 3 in the memory cell 1.

The flash EEPROM 171 in FIG. 14 differs from the flash EEPROM 151 in FIG. 11 in that the common source line SL is grounded. In any operation mode, therefore, the electric potentials of the individual source lines RSLa–RSLm are held at the ground level via the common source line SL.

In write mode, 12 V is applied to the bit line BLm that is connected to the drain region 4 of the selected memory cell 21, while the electric potentials of the other, non-selected bit lines BLa–BLl and BLn–BLz are set to the ground level.

For each memory cell 21 in FIG. 13, the threshold voltage Vth of the select transistor 11 is also 0.5 V. In the selected memory cell 21, therefore, the electrons in the source region 3 travel into the channel region 5, the conductivity of which has been inverted. Accordingly, the cell current flows toward the source region 3 from the drain region 4.

As 12 V is applied to the drain region 4, the electric potential of the floating gate electrode 7 is pulled up by the capacitive coupling between the drain region 4 and the floating gate electrode 7. Consequently, a high electric field is generated between the channel region 5 and the floating gate electrode 7. The electrons in the channel region 5 are thus accelerated to become hot electrons, which are supplied to the floating gate electrode 7 as indicated by an arrow B in FIG. 13. As a result, charges are stored in the floating gate electrode 7 of the selected memory cell 21, and 1-bit data is written and stored there.

As the memory capacity of semiconductor memories is increasing recently, there is a demand for further miniaturization of the above-described split gate memory cells 1 and 21. The miniaturization of the memory cells can be accomplished by simply reducing the dimensions of the individual sections without altering their shapes. This scheme is however limited taking the processing performance of the manufacturing machines which are being developed at present into consideration.

SUMMARY OF THE INVENTION

Accordingly, it is a primary objective of this invention to provide a high-performance and miniaturized split gate type transistor that does not suffer a variation in its characteristics, and a method of fabricating the same.

It is a further objective of this invention to provide a non-volatile semiconductor memory that is free of the conventional problem of excessive erasure and facilitates large scale integration.

To achieve those objects, a transistor according to this invention comprises a semiconductor substrate, a source region and a drain region formed on the semiconductor substrate. A channel region is formed between the source region and the drain region. A floating gate electrode is formed substantially above the channel region. The floating gate electrode has an end surface. A control gate electrode is provided on the semiconductor substrate so as to overlap the floating gate electrode. The control gate electrode has an end surface formed level with the end surface of the floating gate electrode.

A preferable method of fabricating the above transistor comprises the steps of:

forming a first conductive film over a semiconductor substrate;

forming a second conductive film over the first conductive film;

forming a third film having an electrically insulating property on the second conductive film;

patterning the third film by anisotropic etching using an etching mask for forming a control gate electrode; and patterning the first and second conductive films by anisotropic etching using the third film as an etching mask to form the control gate electrode from the second conductive film and a floating gate electrode from the first conductive film.

A non-volatile semiconductor memory can be manufactured using transistors which are fabricated by this method.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

FIG. 12 is an explanatory diagram for the operation modes of the prior art and the first and second embodiments;

FIG. 15 is an explanatory diagram for the operation modes of the prior art and other embodiments.

DETAILED DESCRIPTION OF THE PREFERRED EMBODIMENTS

Figure 1:
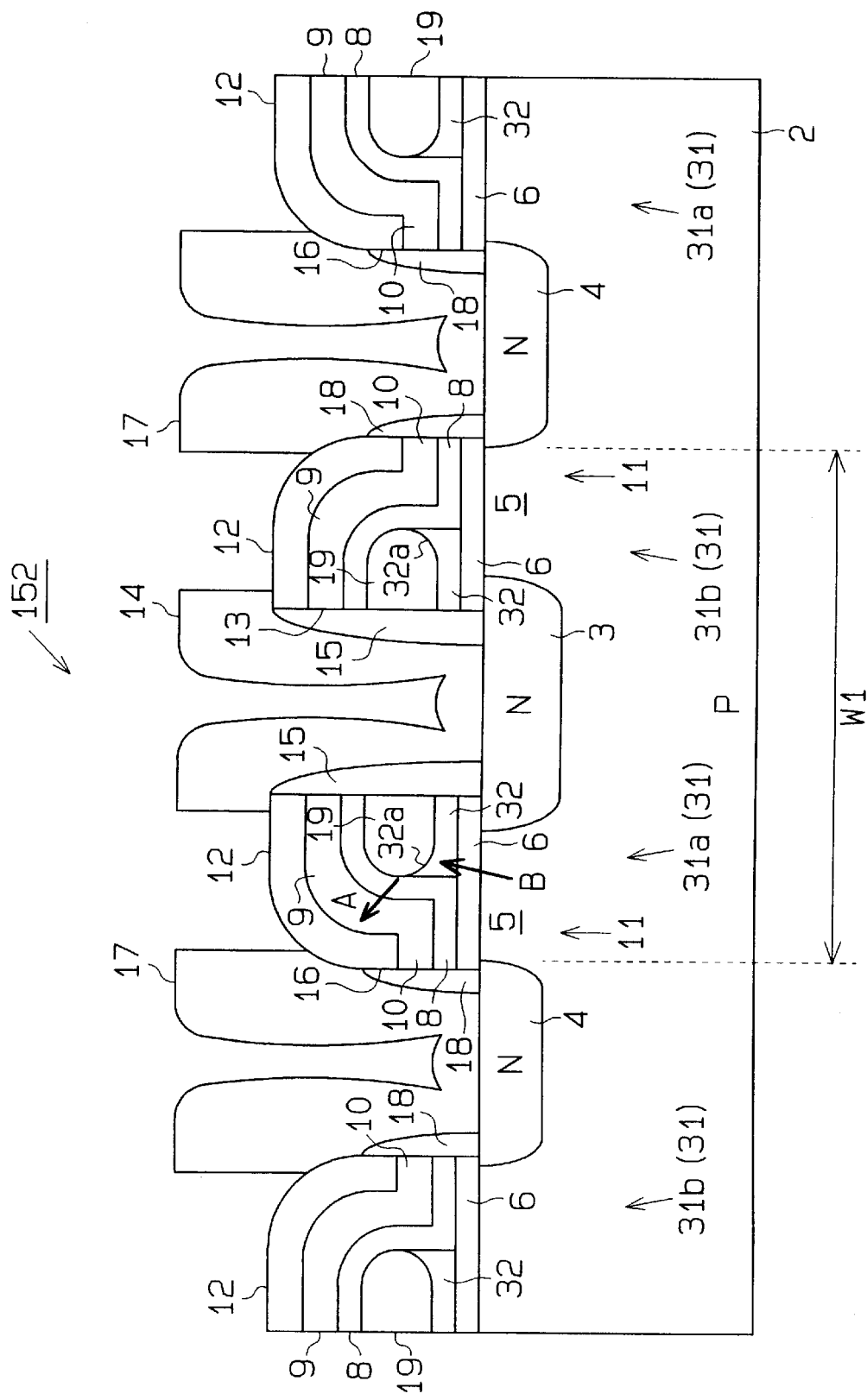
FIG. 1 is a cross-sectional view of a part of the memory cell array of a flash EEPROM according to the first embodiment of this invention.
Figure 2:
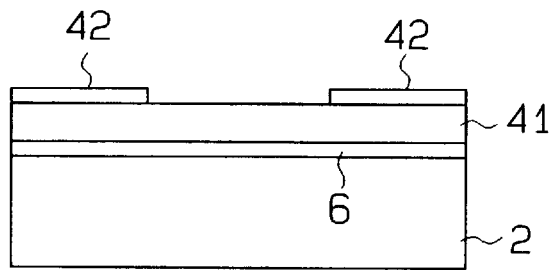
FIGS. 2(a) to 2(d), 3(a) to 3(c), 4(a) to 4(c) and 5(a) to 5c) are schematic cross-sectional views for explaining the fabrication steps for the memory cell array in FIG. 1.
Figure 2:
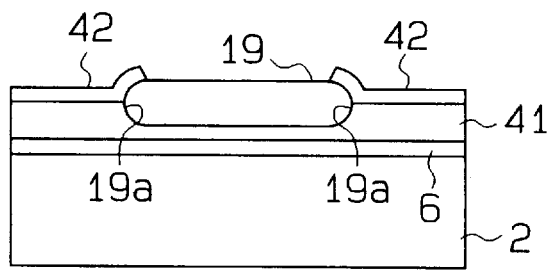
Figure 2:
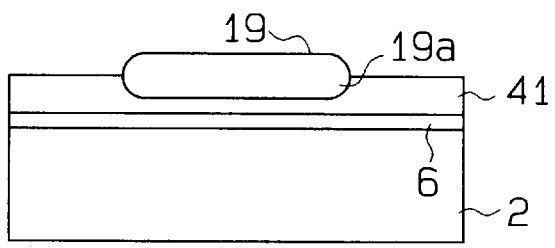
Figure 2:
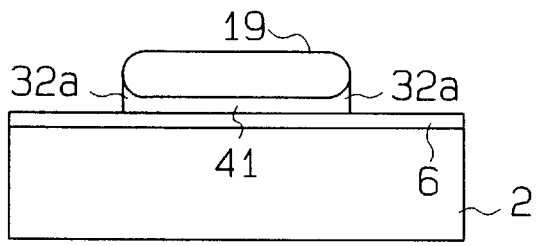
Figure 3:
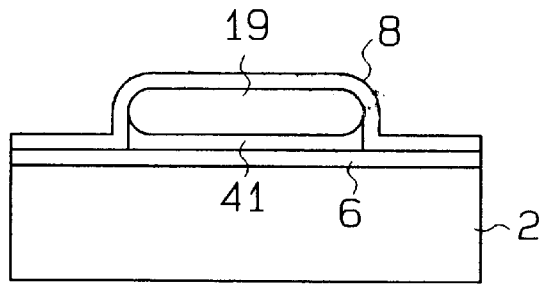
Figure 3:
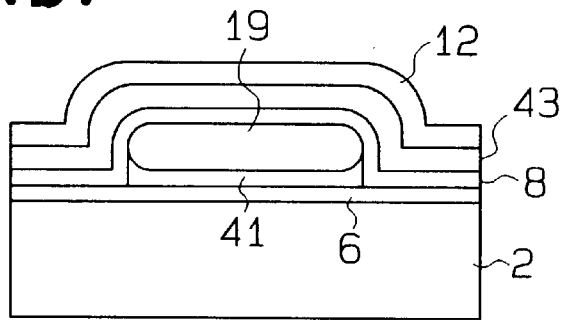
Figure 3:
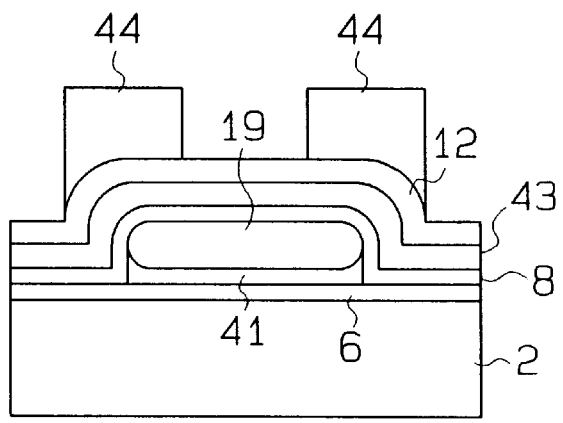
Figure 4:
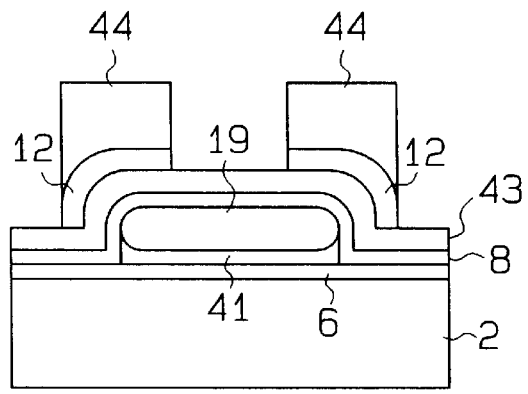
Figure 4:
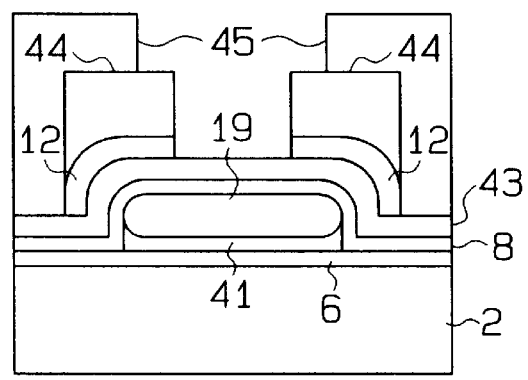
Figure 4:
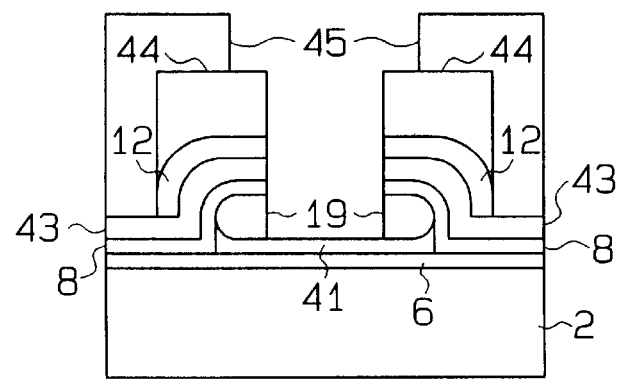
Figure 5:
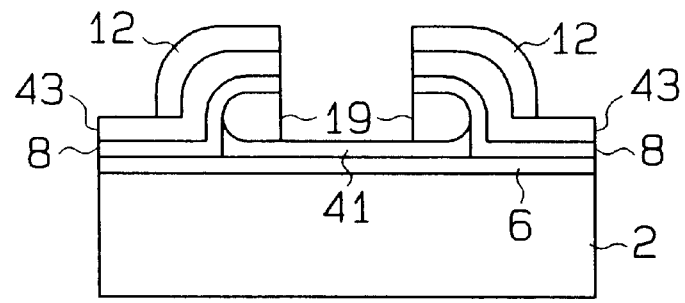
Figure 5:
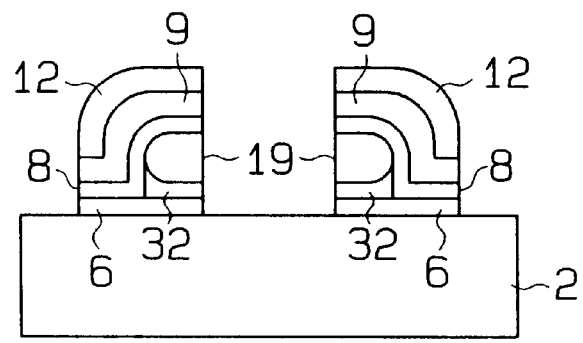
Figure 5:
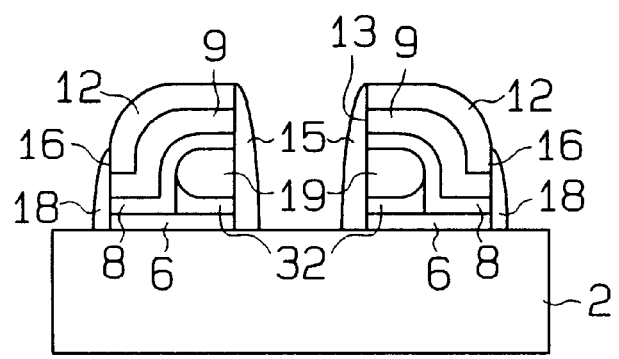

The first embodiment of this invention will now be described with reference to FIG. 1. To avoid a redundant description, like or same reference numerals are given to those components that are like or the same as the corresponding components of the prior art illustrated in FIG. 10.

FIG. 1 is a cross-sectional view showing a part of the memory cell array of a flash EEPROM according to this embodiment. The memory cell array in FIG. 1 differs from that in FIG. 10 in the following points.

A plurality of split gate memory cells (split gate transistors) 31 are arranged on a substrate 2. Each memory cell 31 comprises a source region 3, a drain region 4, a channel region 5, a floating gate electrode 32 and a control gate electrode 9.

To suppress the occupying area on the substrate 2, two memory cells 31 (which will hereinafter be denoted as "31a" and "31b" to distinguish therebetween) share the source region 3 and their floating gate electrodes 32 and control gate electrodes 9 are arranged symmetrically with respect to that common source region 3.

Figure 10:
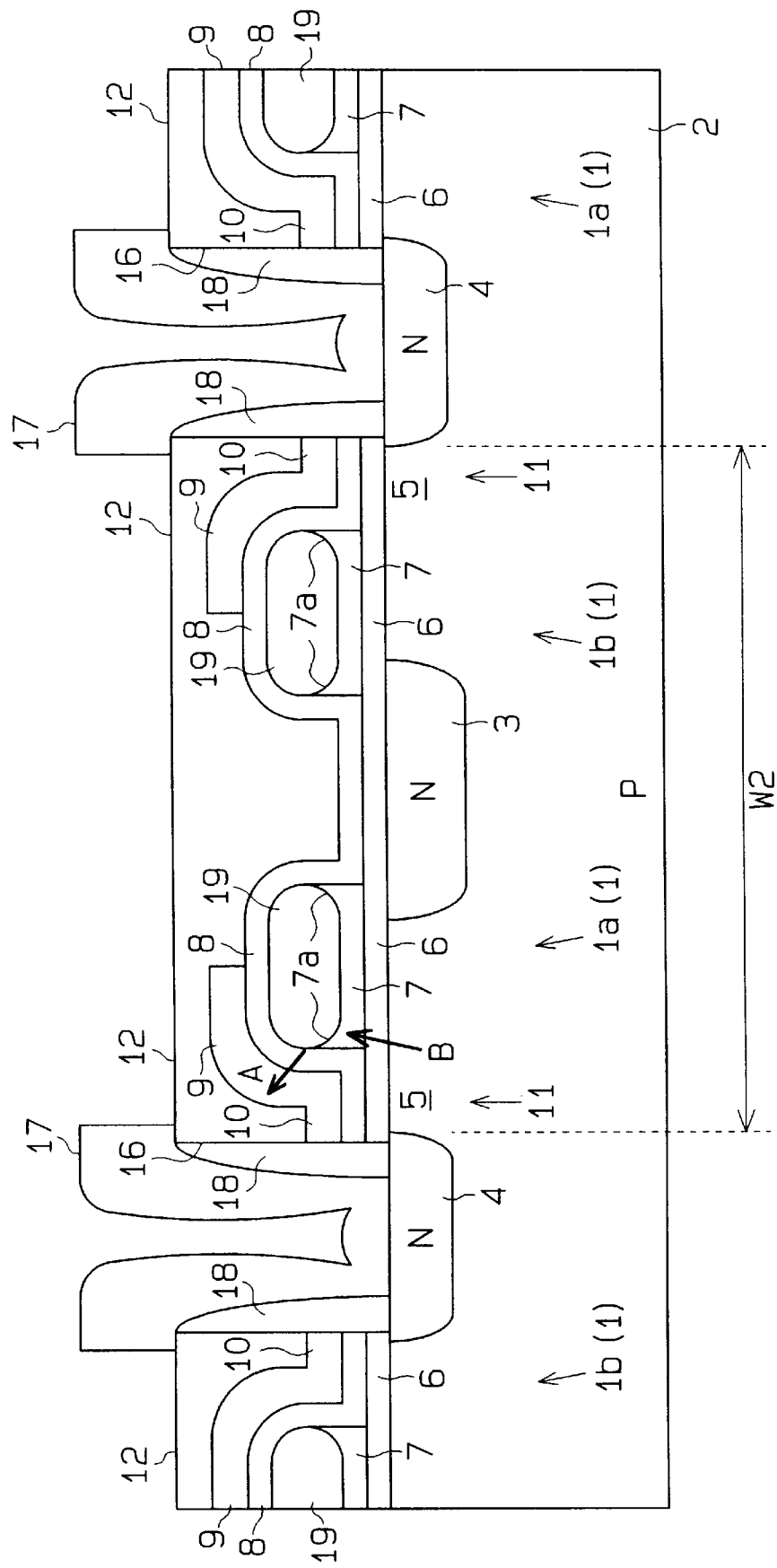
FIG. 10 is a schematic cross-sectional view of a conventional memory cell array.

The floating gate electrode 32 has a shape such as that obtained by vertically bisecting the floating gate electrode 7 of the conventional memory cell 1 shown in FIG. 10 and leaving only the portion that overlaps the control gate electrode 9. Therefore, the control gate electrode 9 completely overlaps the floating gate electrode 32, and the end surfaces of the individual portions that constitute the inner wall of a contact hole 13 (i.e., a passivation film 12, the control gate electrode 9, a tunnel insulator film 8, an insulator film 19, the floating gate electrode 32 and a gate insulator film 6) are formed level with one another in the thickness direction of the substrate 2, or are formed in a self-aligned manner. The opposite end surface of the control gate electrode 9 to a select gate 10 is level with the end surface of the floating gate electrode 32.

A projection 32a is formed at the corner of the upper portion of the floating gate electrode 32 on the select gate (10) side at the same time as the insulator film 19 is formed. The source region 3 is connected to a source electrode 14 in the contact hole 13. A side wall spacer 15 comprised of an insulator film is formed on the inner wall of the contact hole 13. Each of source lines RSLa to RSLm is formed by the source region 3 and the source electrode 14.

Figure 11:
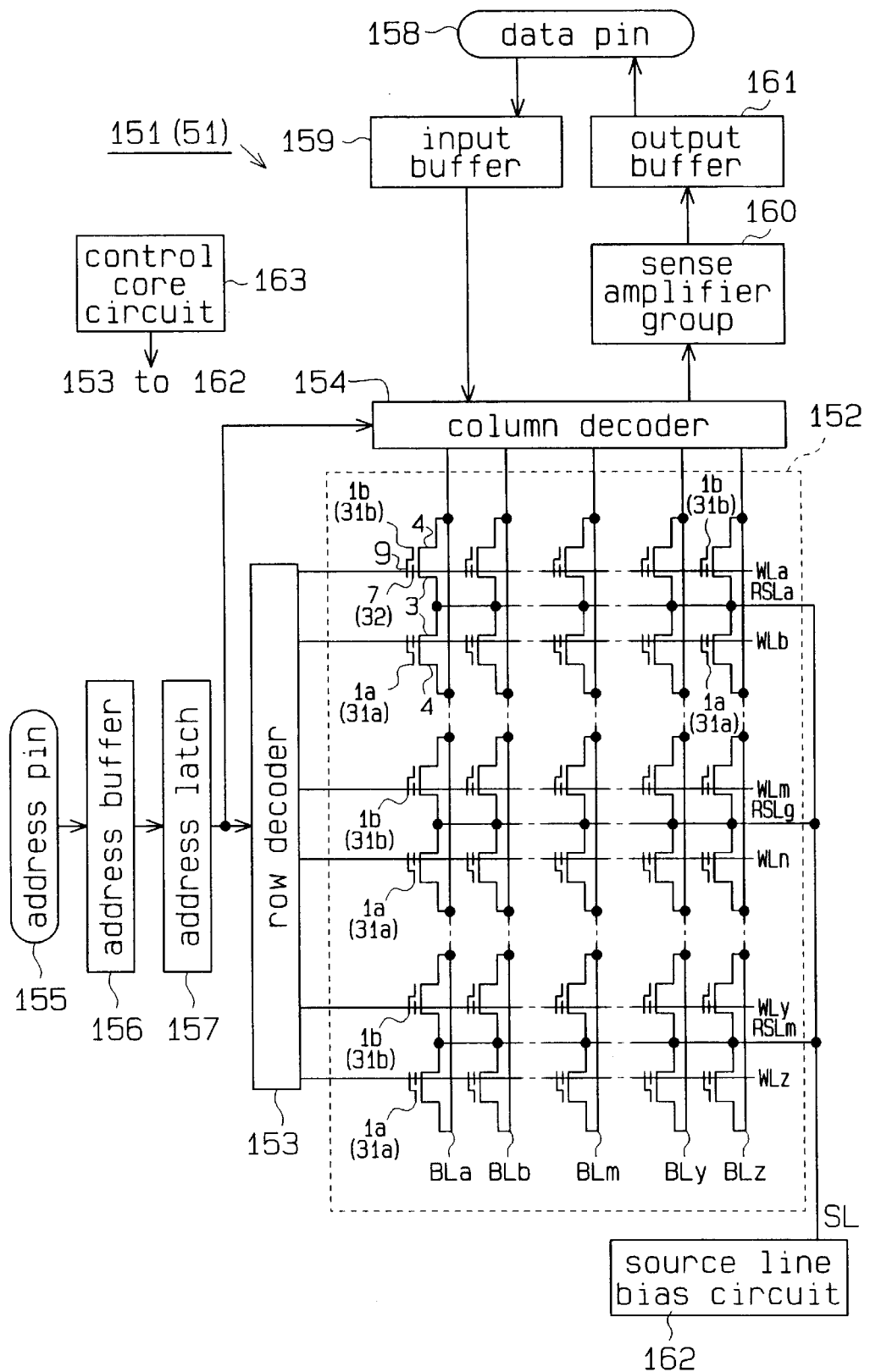
FIG. 11 is a block circuit diagram showing the prior art and the first and second embodiments.
Figure 13:
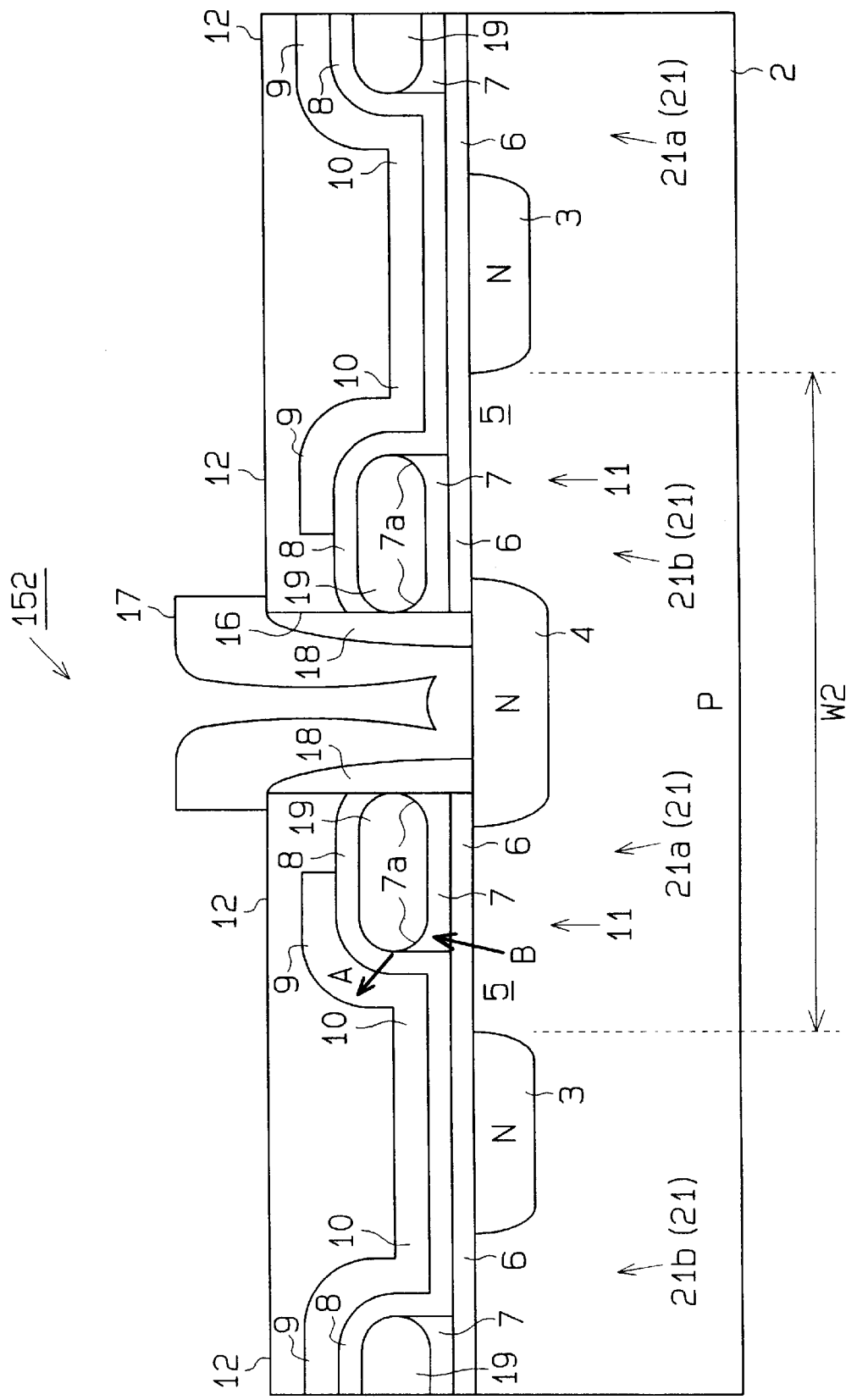
FIG. 13 is a schematic cross-sectional view showing another conventional memory cell array.

The general structure of a flash EEPROM 51 that uses the split gate memory cells 31 according to this embodiment is the same as that of the prior art shown in FIG. 11. The electric potentials at the individual sections of the flash EEPROM 51 in this embodiment in the individual operation modes are the same as those of the prior art illustrated in FIG. 12.

A method of fabricating the memory cells according to this embodiment will now be described with reference to FIGS. 2 to 5.

In step 1 (see FIGS. 2(a) and 2(b)), the gate insulator film 6 comprised of a silicon oxide film is formed on the substrate 2 by thermal oxidization. Then, a doped polysilicon film 41 for the floating gate electrode 32 is formed on the gate insulator film 6. Subsequently, a silicon nitride film 42 is formed on the doped polysilicon film 41 by CVD, after which an opening is formed in the silicon nitride film 42. The doped polysilicon film 41 is oxidized using the silicon nitride film 42 as an oxidization mask, thus forming the insulator film 19. At this time, the end portion of the insulator film 19 enters the end portion of the silicon nitride film 42, forming a bird's beak 19a.

In step 2 (see FIGS. 2(c) and 2(d)), first, the silicon nitride film 42 is removed. Next, the doped polysilicon film 41 is etched by anisotropic etching using the insulator film 19 as an etching mask. Since the bird's beak 19a is formed at the end of the insulator film 19, the upper edge portion of the doped polysilicon film 41 becomes sharper along the shape of the bird's beak 19a at this time, thus forming the projection 32a. The doped polysilicon film 41 after etching will connect the floating gate electrodes 32 of the memory cells 31a and 31b which share the source region 3.

In step 3 (see FIG. 3(a)), using thermal oxidization or LPCVD (Low Pressure Chemical Vapor Deposition) or both, the tunnel insulator film 8 comprised of a silicon oxide film is formed on the entire surface of the device formed by step 2. At this time, the stacked insulator films 6 and 8 are integrated.

In step 4 (see FIG. 3(b)), a doped polysilicon film 43, which will become the control gate electrode, is formed on the entire surface of the device obtained through step 3. Next, the passivation film 12 comprised of a silicon oxide film is formed on the doped polysilicon film 43 by CVD.

Note that the doped polysilicon films 41 and 43 are formed by the following techniques.

1. Mixing an impurity-containing gas at the time of forming the polysilicon film using LPCVD.

2. After forming a non-doped polysilicon film using LPCVD, an impurity diffusion source layer (such as POCl$_3$) is formed on the polysilicon film and an impurity is diffused into the polysilicon film from this impurity diffusion source layer.

3. After forming a non-doped polysilicon film using LPCVD, impurity ions are injected into the polysilicon film.

In step 5 (see FIG. 3(c)), after a resist is coated on the entire surface of the device obtained through the above step, an etching mask 44 for forming the control gate electrode 9 is formed using the ordinary photolithography technique.

In step 6 (see FIG. 4(a)), the passivation film 12 is etched by anisotropic etching using the etching mask 44.

In step 7 (see FIG. 4(b)), after a resist is coated on the entire surface of the device obtained through step 6, an etching mask 45 shaped to have an exposed portion that will later become the contact hole 13 is formed using ordinary photolithography techniques.

In step 8 (see FIG. 4(c)), the doped polysilicon film 43, the tunnel insulator film 8 and the insulator film 19 are etched by anisotropic etching using the etching masks 44 and 45.

In step 9 (see FIG. 5(a)), the etching masks 44 and 45 are removed.

In step 10 (see FIG. 5(b)), the doped polysilicon films 43 and 41 and the insulator films 8 and 6 are etched by anisotropic etching using the passivation film 12 as an etching mask. As a result, the control gate electrode 9 is formed from the remaining doped polysilicon film 43, and the floating gate electrode 32 is formed from the remaining doped polysilicon film 41. In this step 10, the contact holes 13 and 16 are formed. The contact hole 13 is formed in a self-aligned manner with respect to the floating gate electrode 32, the control gate electrode 9 and the source region 3.

In step 11 (see FIG. 5(c)), using CVD, a silicon oxide film is formed on the entire surface of the device obtained through the above step. Next, the entire surface of the silicon oxide film is etched back using the etch-back technique, thus forming the spacers 15 and 18 each of a silicon oxide film. Consequently, the floating gate electrode 32 is electrically isolated from the control gate electrode 9. The surface of the substrate 2, which will later become the source region 3 and the drain region 4, is exposed through the contact holes 13 and 16.

In step 12 (see FIG. 1), phosphorus ions (P$^+$) are injected into the exposed surface of the substrate 2 at the bottom of the contact hole 13 by ion injection, thus forming the source region 3. Then, arsenic ions (As$^+$) are injected into the exposed surface of the substrate 2 at the bottom of the contact hole 16, thus forming the drain region 4.

Subsequently, an aluminum alloy film is formed on the entire surface of the resultant device including the interiors of the contact holes 13 and 16 by PVD (Physical Vapor Deposition), and the aluminum alloy film is then patterned to form the source electrode 14 and drain electrode 17.

This embodiment exhibits the following advantages. The split gate memory cells 31, like the split gate memory cells 1, are provided with the select transistors 11, so that each memory cell 31 has the self-selecting capability. Even if excessive erasure occurs in the flash EEPROM 51 using the split gate memory cells 31, therefore, the conductive/nonconductive states of the memory cells 31 are controlled by the select transistors 11 so that the excessive erasure does not raise any problem.

As apparent from comparison between FIGS. 1 and 10, the width of the floating gate electrode 32 of the memory cell 31 in this embodiment is a half the width of the floating gate electrode 7 of the conventional memory cell 1. It is thus possible to acquire more miniaturized split gate memory cells 31. For example, the width W2 between the drain regions 4 of the adjoining two memory cells 1a and 1b in FIG. 10 is 2.4 μm, whereas the width W1 between the drain regions 4 of the adjoining two memory cells 31a and 31b in FIG. 1 is 1.8 μm. Apparently, the width W1 between the drain regions 4 of the adjoining memory cells 31 can be reduced to 75% of the width W2 between the drain regions 4 of the conventional memory cells 1.

The electrostatic capacitances between the source region 3 and the floating gate electrode 32 are set significantly greater than the electrostatic capacitance between the control gate electrode 9 and the floating gate electrode 32. When the electric potential of the control gate electrode 9 is 14 to 15 V and the electric potential of the drain is 0 V in erase mode, therefore, a high electric field is produced between the control gate electrode 9 and the floating gate electrode 32. Consequently, the FN tunnel current flows between both gate electrodes, so that electrons in the floating gate electrode 32 are drained toward the control gate electrode 9, as indicated by an arrow A in FIG. 1, to erase data stored in the memory cell 31. At this time, the electrons in the floating gate electrode 32 jump out from the projections 32 and travel toward the control gate electrode 9. This facilitates the electron migration and thus ensures efficient drawing of the electrons from the floating gate electrode 32.

The threshold voltage Vth of the select transistor 11 of each memory cell 31 is 0.5 V. In the selected memory cell 31 in write mode, therefore, the electrons in the drain region 4 travel into the channel region 5 the conductivity of which has been inverted. Accordingly, the cell current flows toward the drain region 4 from the source region 3.

As a voltage of 12 V is applied to the source region 3, the electric potential of the floating gate electrode 32 is pulled up by the capacitive coupling between the source region 3 and the floating gate electrode 32. As a result, a high electric field is produced between the channel region 5 and the floating gate electrode 32. Thus, the electrons in the channel region 5 are accelerated to become hot electrons which are supplied to the floating gate electrode 32 as indicated by an arrow B in FIG. 1. Consequently, charges are stored in the floating gate electrode 32 of the selected memory cell 31 and 1-bit data is written and stored there.

As apparent from the foregoing description, only the portion of the floating gate electrode 32 that overlaps the control gate electrode 9 is used in the erase mode and write mode. The portion of the floating gate electrode 32 that does not overlap the control gate electrode 9 hardly contributes to the operation of the associated memory cell 1. In view of this, removing the portion of the floating gate electrode 32 that does not overlap the control gate electrode 9 does not affect the performance of the floating gate electrode 32 in each operation mode.

The end surface of the floating gate electrode 32 on the inner wall of the contact hole 13 is formed, and the end surfaces of the gate electrodes 9 and 32 are made level with each other through the above-discussed steps 6, 8 and 10. That is, the floating gate electrode 32 is formed in a self-aligned manner with respect to the control gate electrode 9. Therefore, the positional deviation between the gate electrodes 9 and 32 is reduced, thus the dimensional precision is improved.

The source region 3 is connected to the source electrode 14 through the contact hole 13, and each of source lines RSLa to RSLm is formed by the source region 3 and the source electrode 14. It is therefore possible to reduce the resistance of each of the source lines RSLa to RSLm by the source electrode 14 formed of an aluminum alloy film as compared with the case where each source line is formed by the source region 3 alone.

If the electric resistances of the source lines RSLa–RSLm are high, the characteristics of the memory cells 1 that are connected to those source lines RSLa–RSLm may vary due to voltage drops in the source lines RSLa–RSLm. According to this embodiment, however, the provision of the source electrode 14 reduces the resistance of each of the source lines RSLa–RSLm, thus preventing a variation in the characteristics of the memory cells 1 caused by the electric resistances of the source lines.

According to the prior art, misalignment between the source region 3 and the control gate electrode 9 may occur at the time of forming the source region 3. In the case where each of the source lines RSLa–RSLm is formed only by the source region 3, if such misalignment occurs, the coupling ratio of the memory cells 1b that are connected to an odd word line (WLa, . . . , WLm, . . . or WLy) differs from the coupling ratio of the memory cells 1a that are connected to an even word line (WLb, . . . , WLn, . . . or WLz). As a result, the amount of hot electrons to be supplied to the floating gate electrode 32 varies between the memory cells 1b and 1a in write mode, which may result in a variation in the characteristics.

Since the source electrode 14 is formed of aluminum alloy filled in the contact hole 13 in this embodiment, however, no misalignment between the source region 3 and the control gate electrode 9 occurs and variation in the characteristics of the memory cells 31b and 31a due to such misalignment does not occur. It is therefore possible to acquire the high-performance memory cells 31 that reduce variation in characteristics.

The second embodiment of this invention will now be described with reference to the accompanying drawings. The description will be directed mainly to the differences from the first embodiment. To avoid a redundant description, like or same reference numerals are given to those components of the second embodiment that are like or the same as the corresponding components of the first embodiment and the prior art illustrated in FIGS. 1 to 5, 11 and 12.

Figure 6:
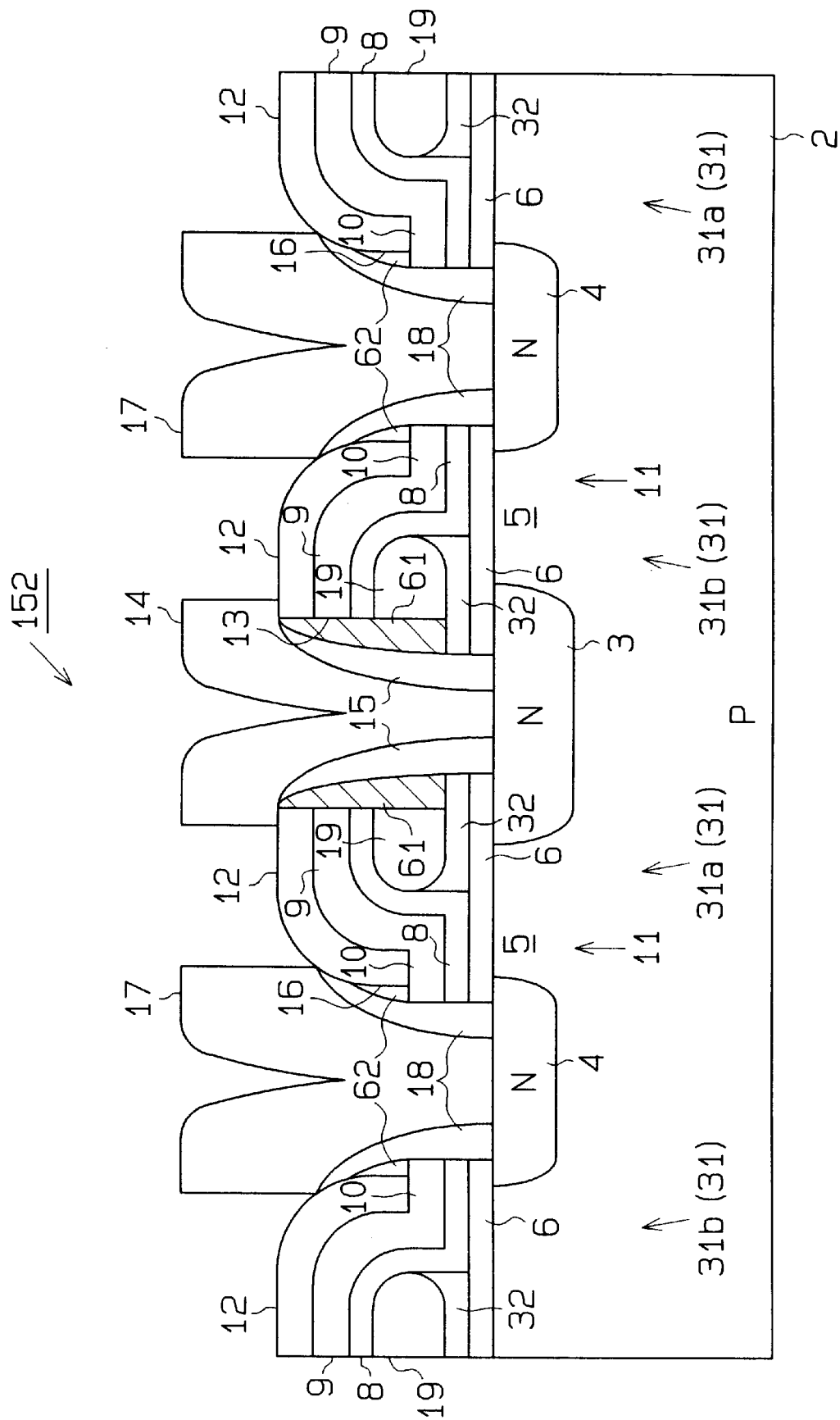
FIG. 6 is a schematic cross-sectional view of a memory cell array according to the second embodiment of this invention.
Figure 7:
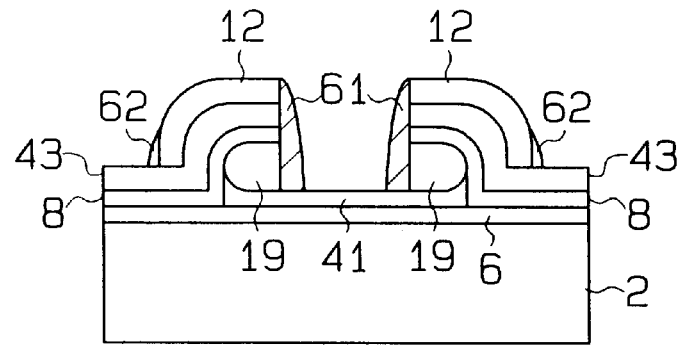
FIGS. 7(a) through 7(c) are schematic cross-sectional views for explaining the fabrication steps for the memory cell array in FIG. 6.
Figure 7:
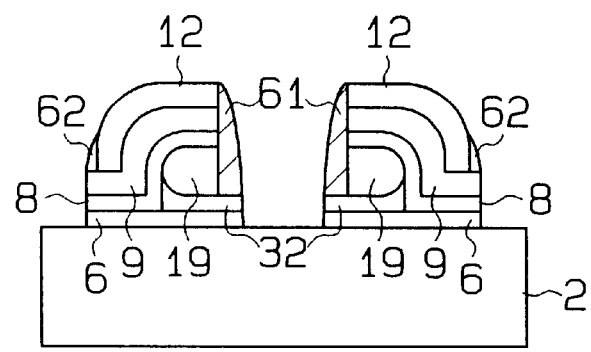
Figure 7:
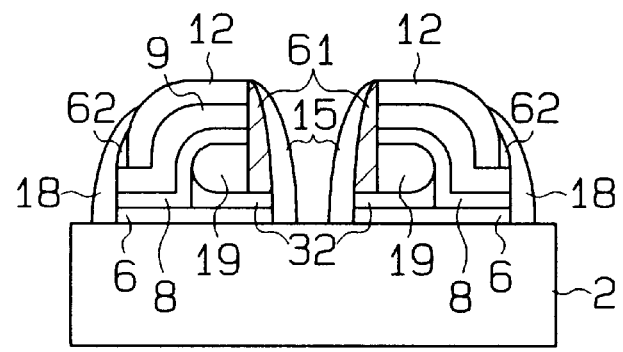

FIG. 6 is a cross-sectional view showing a part of the memory cell array of a flash EEPROM according to the second embodiment, which differs from the memory cell array in FIG. 1 in the following points.

An additional spacer 61 is provided inward of the spacer 15 in such a way as to contact the individual portions of the inner wall of the contact hole 13, namely, the end surfaces of the passivation film 12, the control gate electrode 9, the tunnel insulator film 8 and the insulator film 19. Accordingly, the control gate electrode 9 does not entirely overlap the floating gate electrode 32, and the floating gate electrode 32 protrudes from the control gate electrode 9 by the thickness of the inner spacer 61 as one sees the gate electrodes 32 and 9 from above the substrate 2.

An additional spacer 62 is provided on a part of the inner wall of the contact hole 16, i.e., on the end surfaces of the passivation film 12 and the control gate electrode 9.

This memory cell array is fabricated using substantially the same procedures as employed in the first embodiment. The fabrication method will now be discussed with reference to FIGS. 2 to 5 and 7.

Steps 1 through 9 (see FIG. 5(a)) in this fabrication method are the same as the steps 1 to 9 of the first embodiment. In step 10 (see FIG. 7(a)), a silicon oxide film is formed, by CVD, on the entire surface of the device obtained through the previous steps. Next, the silicon oxide film is etched back by the full etch-back technique, thus forming the spacers 61 and 62 of the silicon oxide film.

In step 11 (see FIG. 7(b)), the doped polysilicon films 43 and 41 and the insulator films 8 and 6 are etched by anisotropic etching using the passivation film 12 and the spacers 61 and 62 as etching masks. As a result, the control gate electrode 9 is formed from the remaining doped polysilicon film 43, and the floating gate electrode 32 is formed from the remaining doped polysilicon film 41.

In step 12 (see FIG. 7(c)), a silicon oxide film is formed, by CVD, on the entire surface of the device obtained through the above step. Next, the silicon oxide film is etched back using the full etch-back technique, thus forming the spacers 15 and 18 of the silicon oxide film. Step 13 (see FIG. 1) is the same as step 12 of the first embodiment.

As apparent from the above, this embodiment has the following advantages in addition to those of the first embodiment.

The length of the portion of the floating gate electrode 32 protruding from the control gate electrode 9 can be adjusted by adjusting the thickness of the additional spacer 61. The thickness of the spacer 61 should be controlled accurately by precisely controlling the thickness and the etch-back amount of the silicon oxide film in step 10. It is thus very easy to adjust the thickness of the spacer 61.

The provision of the additional spacer 61, the thickness of which is adjustable, permits the protruding length of the floating gate electrode 32 to be altered, so that the amount of charges storable in the floating gate electrode 32 can be controlled.

The coupling ratio of the control gate electrode 9 and the floating gate electrode 32 can be adjusted by controlling the size of the floating gate electrode 32. This increases the freedom in designing the semiconductor memory.

In step 11, as the doped polysilicon film 41 is etched using the passivation film 12 and the inner spacer 61 as etching masks, the end surface of the floating gate electrode 32 on the inner wall of the contact hole 13 is formed. That is, the floating gate electrode 32 is formed in a self-aligned manner with respect to the control gate electrode 9. If the thickness of the inner spacer 61 is precisely controlled, therefore, the positional deviation between the gate electrodes 9 and 32 is reduced. This contributes to improving the dimensional precision.

The first and second embodiments may be modified as follows. In such modifications, the same advantages as those described above can be obtained.

The insulator films 6 and 8 may be replaced with insulator films of another material, such as silicon nitride. Each of the insulator films 6 and 8 may be replaced with one that has various kinds of insulator films stacked one on another.

The material for the gate electrodes 32 and 9 may be changed to other conductive materials than doped polysilicon, e.g., one of various other kinds of metals including a high-melting point metal, such as silicide. Any material can be used for the passivation film 12 so long as it has a different etching rate from that of the floating gate electrode 32.

If doped polysilicon is used as the material for the floating gate electrode 32, the material for the passivation film 12 may be replaced with silicon nitride. Further, the passivation film 12 may be replaced with a conductive film, the etching rate of which differs from that of the floating gate electrode 32. In this case, a passivation film should be separately formed to electrically isolate the source electrode 14 and the drain electrode 17 from the control gate electrode 9 before the formation of those electrodes 14 and 17.

In the second embodiment, any material can be used for the inner spacer 61 so long as its etching rate differs from that of the floating gate electrode 32. If doped polysilicon is used for the floating gate electrode 32, the material for the inner spacer 61 may be replaced with silicon nitride.

The P type single crystalline silicon substrate 2 may be replaced with a P type well. The phosphorus ions that are injected to form the source region 3 may be changed to other N type impurity ions, such as arsenic ions or antimony ions. The arsenic ions, which are injected to form the drain region 4, may be changed to other N type impurity ions, such as phosphor ions or antimony ions.

The P type single crystalline silicon substrate 2 may be replaced with an N type single crystalline silicon substrate or an N type well in which case P type impurity ions, such as boron ions or indium ions, may be used as the impurity ions that are injected to form the source region 3 and the drain region 4.

Figure 8:
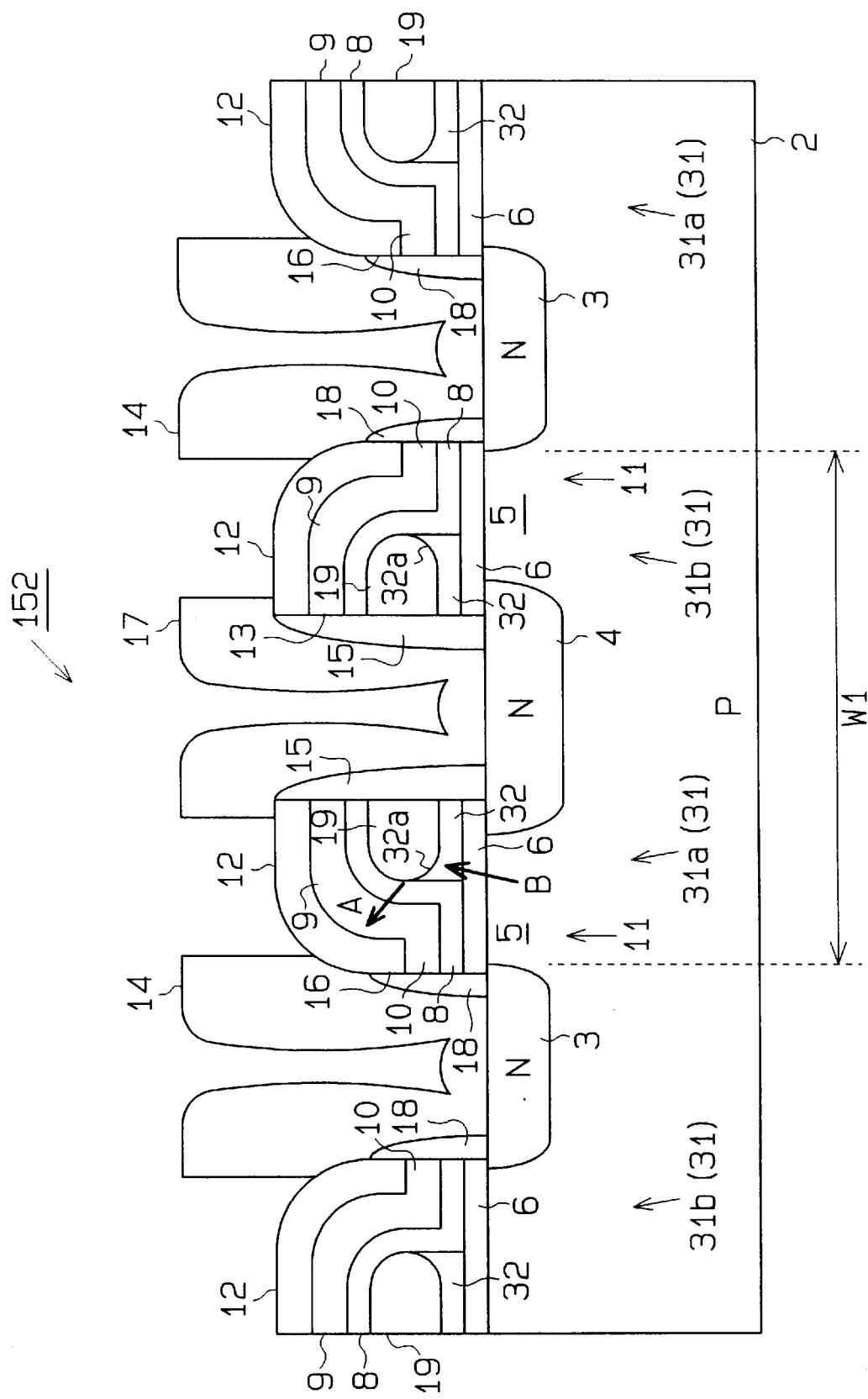
FIG. 8 is a schematic cross-sectional view of a memory cell array according to another embodiment of this invention.
Figure 9:
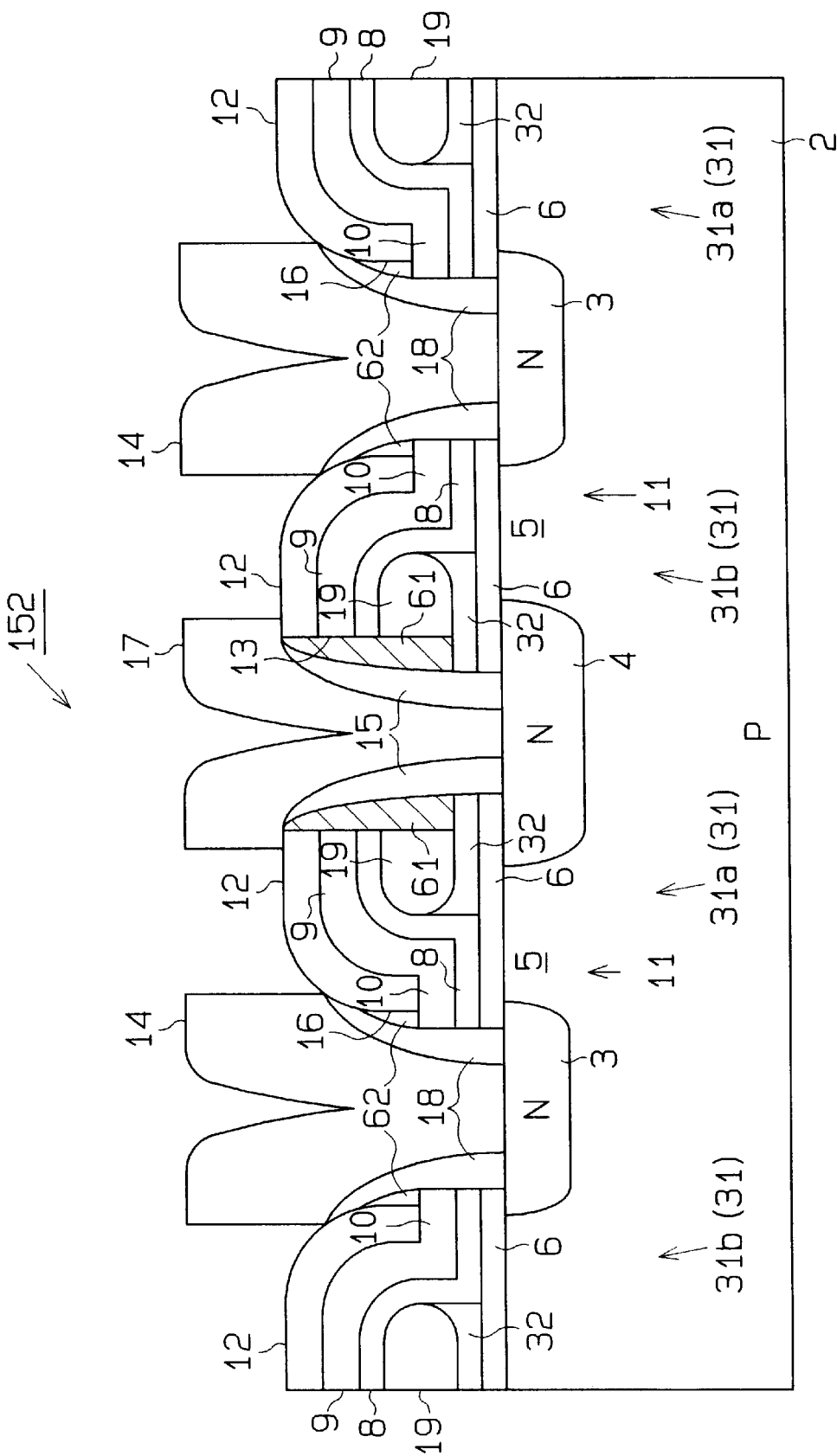
FIG. 9 is a schematic cross-sectional view of a memory cell array according to a further embodiment of this invention.
Figure 14:
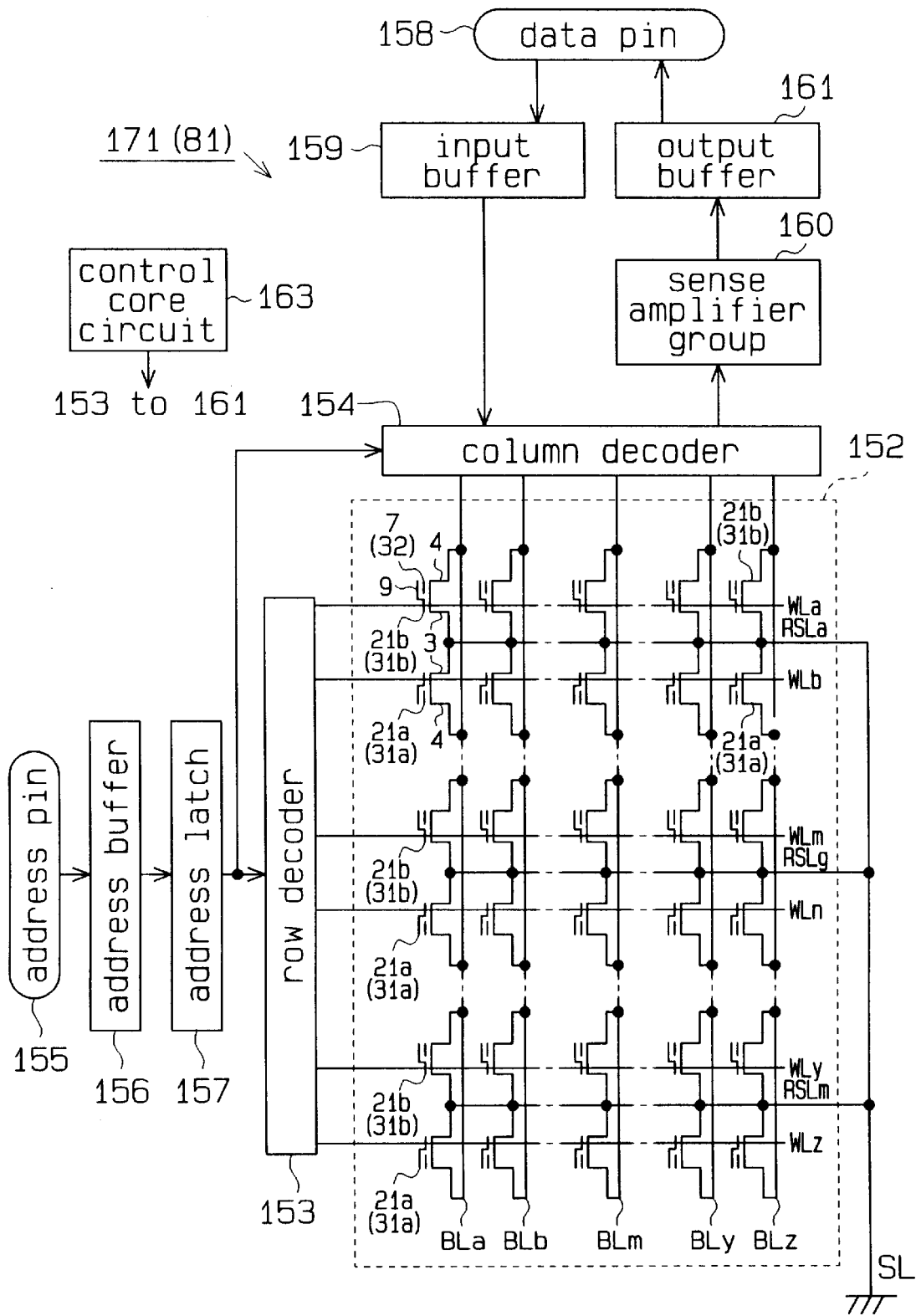
FIG. 14 is a block circuit diagram of the memory cell array in FIG. 13.

In the first embodiment, the source region 3 of the split gate memory cell 31 may be changed to a drain region and the drain region 4 may be changed to a source region. FIG. 8 presents a partial cross-sectional view of the memory cells 31 in that case. The same may be applied to the second embodiment, and FIG. 9 presents a partial cross-sectional view of the memory cells 31 in that case. The general constitution of a flash EEPROM 81 in either case is the same as that of the prior art illustrated in FIG. 14. The electric potentials at the individual sections of the flash EEPROM 81 in the individual operation modes in either modification are the same as those of the prior art illustrated in FIG. 15.

What is claimed is:

1. A transistor comprising:

a semiconductor substrate extending in a horizontal plane;

a source region and a drain region formed on the semiconductor substrate;

a channel region formed between the source region and the drain region;

a floating gate electrode formed above at least a portion of the channel region, the floating gate electrode having an end surface;

a control gate electrode provided over the semiconductor substrate and over the floating gate electrode, so as to overlap at least a portion of the floating gate electrode, the control gate electrode having an end surface;

an inner spacer covering the end surface of the control gate electrode, the inner spacer comprising an insulating film and having an outer surface and a thickness in a horizontal direction, wherein the floating gate electrode horizontally extends from an end of the control gate electrode by a distance that is substantially equal to the thickness of the inner spacer; and an outer spacer covering the end surface of the floating gate electrode and the outer surface of the inner spacer.

2. The transistor according to claim 1, wherein part of the control gate electrode is positioned over the channel region for forming a select gate, the select gate being located opposite to the end surface of the control gate electrode.

3. The transistor according to claim 2 further comprising a gate insulator film for electrically insulating the floating gate electrode from the semiconductor substrate.

4. The transistor according to claim 3 further comprising a tunnel insulating film for electrically insulating the control gate electrode from the floating gate electrode.

5. The transistor according to claim 4, wherein the gate insulating film has an end surface that is formed substantially level with the end surface of the floating gate electrode, the end surfaces of the gate insulating film and the control gate electrode being covered with the outer spacer.

6. The transistor according to claim 5, wherein the tunnel insulating film has an end surface that is formed substantially level with the end surface of the control gate electrode, the end surfaces of the tunnel insulating film and the control gate electrode being covered with the inner spacer.

7. The transistor according to claim 1 further comprising a source electrode connected to the source region, the source electrode being insulated from the floating gate electrode by the outer spacer.

8. A non-volatile semiconductor memory having the transistor according to claim 1 as a memory cell.

9. A transistor comprising:

a semiconductor substrate extending in a horizontal plane;

a source region and a drain region formed on the semiconductor substrate;

a channel region formed between the source region and the drain region;

a floating gate electrode formed above at least part of the channel region, the floating gate electrode having an end surface and storing electric charge;

a control gate electrode formed over the semiconductor substrate and the floating gate electrode and partially overlapped by the floating gate electrode, the control gate electrode having an end surface;

an inner spacer covering the end surface of the control gate electrode, the inner spacer including an insulating film and having an outer surface and a thickness in a horizontal direction, wherein the floating gate electrode is aligned with the inner spacer and horizontally extends from the end surface of the control gate electrode by a distance that is substantially equal to the thickness of the inner spacer; and an outer spacer covering the end surface of the floating gate electrode and the outer spacer of the inner spacer.

\* \* \* \* \*